United States Patent [19]

Frankeny

[11] Patent Number: 5,760,601
[45] Date of Patent: Jun. 2, 1998

[54] TRANSMISSION LINE DRIVER CIRCUIT FOR MATCHING TRANSMISSION LINE CHARACTERISTIC IMPEDANCE

[75] Inventor: Richard Francis Frankeny, Elgin, Tex.

[73] Assignee: International Business Machines Corporation, Armonk, N.Y.

[21] Appl. No.: 703,318

[22] Filed: Aug. 26, 1996

[51] Int. Cl.$^6$ ................................................. H03K 17/16
[52] U.S. Cl. ................................. 326/30; 326/21; 326/83; 327/309
[58] Field of Search ........................... 326/21, 27, 30, 326/82, 83, 86; 327/112, 180, 309

[56] References Cited

U.S. PATENT DOCUMENTS

| | | |
|---|---|---|
| 4,890,010 | 12/1989 | Neudeck et al. . |
| 5,165,046 | 11/1992 | Hesson . |
| 5,206,544 | 4/1993 | Chen et al. . |
| 5,220,208 | 6/1993 | Schenck .......................... 326/27 X |
| 5,294,845 | 3/1994 | McMahan et al. ................ 326/83 X |
| 5,313,118 | 5/1994 | Lundberg . |
| 5,329,190 | 7/1994 | Igarashi et al. . |
| 5,414,583 | 5/1995 | Jordan . |
| 5,418,475 | 5/1995 | Otaka . |
| 5,438,282 | 8/1995 | Kuo . |
| 5,440,182 | 8/1995 | Dobbelaere . |
| 5,463,331 | 10/1995 | Kuo . |
| 5,578,939 | 11/1996 | Beers et al. ......................... 326/30 |
| 5,596,285 | 1/1997 | Marbot et al. ...................... 326/30 |
| 5,666,078 | 9/1997 | Lamphier et al. ................ 326/30 X |

*Primary Examiner*—David R. Hudspeth
*Attorney, Agent, or Firm*—Casimer K. Salys

[57] ABSTRACT

A source terminated transmission line driver circuit with precise impedance matching capability and particularly suited for the output drivers of integrated circuit devices. The output transistors are operated in a current source mode using a common reference current, transistor dimension scaling, and current mirrors. The magnitude of the current provided by the output transistors is established to match the boundary conditions of the transmission line at turn-on and inherently matches the impedance characteristics upon the return of the reflected wave through conduction changes in the output transistors responsive to the transmission line voltage. The driver circuit transmits data signals over single or bus lines with minimum ringing.

12 Claims, 5 Drawing Sheets

VOLTAGE-TO-CURRENT CONVERTER

TRANSMISSION LINE DRIVER CIRCUIT FOR MATCHING TRANSMISSION LINE CHARACTERISTIC IMPEDANCE

FIELD OF THE INVENTION

The present invention relates generally to electronic circuits for driving data onto lines. More particularly, the invention is directed to push-pull driver circuits used to drive lines characterized as source terminated transmission lines, both individually and in bus configurations.

BACKGROUND OF THE INVENTION

The clock rates of digital electronic devices, such as in computers or workstations, now routinely operate at 200 Mhz. At such frequencies the transmission of data, and particularly where such transmission is between integrated circuit devices (chips/die/multichip modules) over single or multiple line buses of a printed circuit board, requires that the circuits driving the device ports to which the lines are connected provide impedance matching to the characteristic impedance of the lines as an aspect of minimizing signal reflections. Reflections (ringing) of signals impressed upon the lines delay the time when accurate sampling can be accomplished, both at the receiving end of the line and at any intermediate taps along the line.

Conventional source terminated transmission line driver circuits utilize either very low impedance output amplifiers in conjunction with an output resistor, whose resistance value matches the characteristic impedance of the line, or push-pull field effect transistors having an intrinsic on-state impedance matching the characteristic impedance of the transmission line. Unfortunately, accurate resistors of low impedance are very difficult to fabricate on integrated circuit devices, and standard fabrication process variations alter the on-state resistance of field effect transistors over a typical range of 3:1, chip-to-chip.

What is needed is a design for a source terminated transmission line driver circuit which does not use a discrete resistor external to the integrated circuit chip for each driven line to provide the impedance matching, and does not exhibit the broad fabrication process induced variations characterizing typical output driver transistors.

SUMMARY OF THE INVENTION

The problems of the prior art are addressed and solved through a push-pull circuit suited to drive binary signals onto a transmission line of characteristic impedance, comprising series connected first and second current sources, with a first transmission line connected to a node defined at the connection between the first and second current sources, means for operating the first current source to drive a first current into the first transmission line responsive to a signal of first binary state, means for disabling the second current source responsive to the signal of first binary state, means for operating the second current source to sink a second current, substantially identical in magnitude to the first current, from the first transmission line responsive to a signal of second binary state, the second binary state being a complement of the first state, and means for disabling the first current source responsive to the signal of second binary state. In a further refinement, the apparatus provides that the series connected first and second current sources are connected between a supply voltage and ground, and that the first and second current sources provide a current nominally equal to half the magnitude of the supply voltage divided by the characteristic impedance of the first transmission line.

In a particularized practice of the invention, field effect transistors are configured in a push-pull arrangement with the transmission line connected therebetween. The individual field effect transistors are operated in a current mirror mode at the specified current magnitude of the supply voltage divided by twice the characteristic impedance to meet output signal boundary conditions. Matching of the output impedance to the characteristic impedance of the transmission line is accomplished inherently by the interaction of the current mirror voltage with the voltage on the transmission line upon the receipt of the reflected wave. The invention is particularly suited for driving the output pins of an integrated circuit connected to a data, address, or like bus.

These and other features of the invention will be more clearly understood and appreciated upon considering the detailed embodiment set forth hereinafter.

DESCRIPTION OF THE PREFERRED EMBODIMENT

Figure 1:
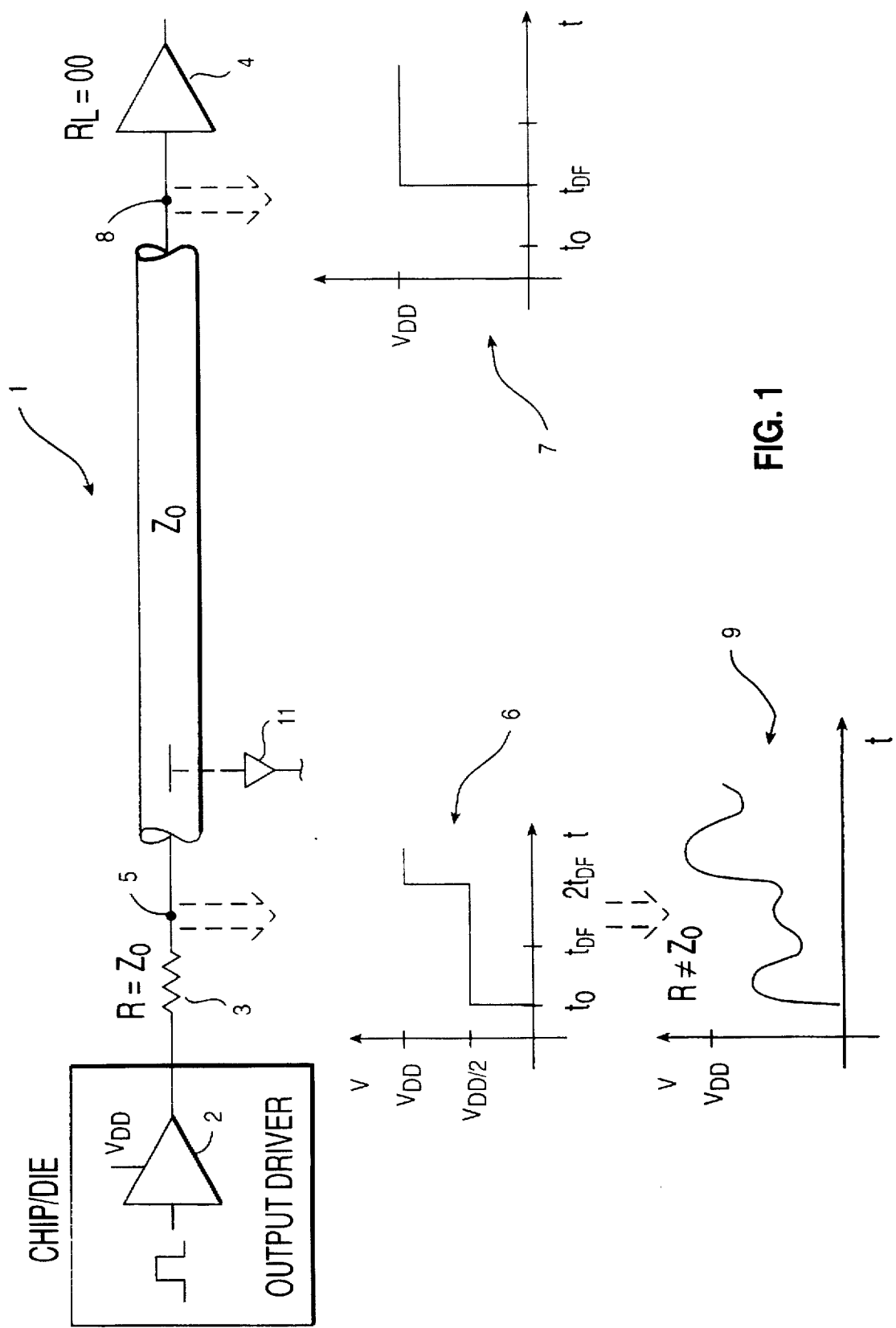
FIG. 1 is a schematic of a generic transmission line driver circuit, and related drive signal characteristics.
Figure 2:
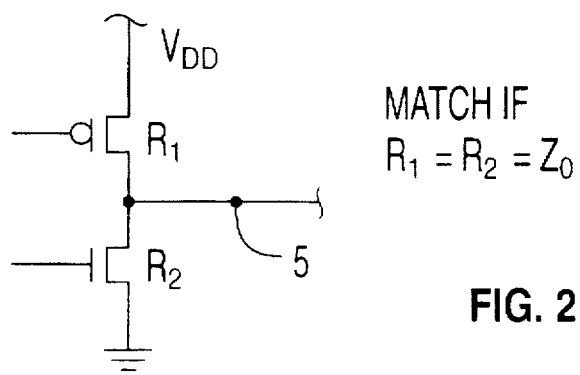
FIG. 2 is a schematic diagram of a conventional driver circuit, where the field effect transistor resistance is intended to match the characteristic impedance of the transmission line.

FIG. 1 schematically depicts a source terminated transmission line, generally at 1, having a characteristic impedance $Z_0$. Transmission line 1 can be an individual electrical wire or one of multiple bus conductors in a cable or upon a printed circuit board, the latter being the context within which the invention is described. In such setting, a very low impedance chip/die integrated circuit output driver 2 provides a step output voltage $V_{DD}$ through output resistor 3, whose resistance matches the characteristic impedance $Z_0$ of the transmission line, with amplifying sensor 4 at the terminating end of the transmission line 1 having a substantially infinite input impedance. The source terminated transmission line so described provides signals of the type depicted in the plots at 6 and 7, where the plot at 6 shows the initial step, at input node 5 to transmission line 1, having a voltage of $V_{DD}/2$ followed after 2 increments of transmission line time of flight delay with a reflected signal of voltage $V_{DD}/2$. At node 8, the receiving end of the line, the voltage $V_{DD}$ appears after one time of flight delay through the combination of the transmitted and reflected waves at node 8 on transmission line 1. The plot at 9 illustrates one form of ringing, when the output impedance of the driver system amplifier 2 and resistor 3 have an impedance which does not match the characteristic impedance of transmission line 1. In such context, the ringing necessitates that sampling of the data on the transmission line be delayed until a stable level exists. The greater the impedance mismatch, the greater the reflection and ringing, the longer the delay before sampling is reliable. Also, note that sampling amplifier 9 connected at a tap along transmission line 1 must wait not only for the return wave, but also for each significant ringing wave to travel both directions along the transmission line.

Where integrated circuit devices are being used to drive source terminated transmission lines it is common to use discrete resistors 3 on printed circuit boards to ensure an accurate match between the output impedance of the driver and the characteristic impedance of the line. In part this is attributable to the fact that it is difficult to accurately control absolute values of resistance within integrated circuits, and especially so when the magnitude of the resistance is in the relatively low range of 50 ohms as is typical of printed circuit board lines. Since discrete devices are very undesirable from a manufacturing standpoint because of their relatively large size and additional fabrication operations. Attempts have been made to refine field effect transistor designs, such as depicted in FIG. 2, so that the on-state resistance through each transistor, specified in the figure as $R_1$ and $R_2$, matches the characteristic impedance Z, of the transmission line. Unfortunately, that too has proven to be of limited success in that the resistive characteristics of such output driver transistors are difficult to control better than over a 3:1 range from chip-to-chip. As the mismatch between the output impedance of the transistor and the characteristic impedance of the transmission line increases, so too does the ringing and associated delay in sampling of the data on the line.

The present invention provides an output driver design which meets the requirements of a source terminated transmission line using current sources and current sinks of prescribed current magnitude, and a structural relationship to drive transmission line 1 with substantially no ringing. The design of the current source and current sink satisfy the boundary conditions while providing inherent resources for suppressing ringing effects.

Figure 3:
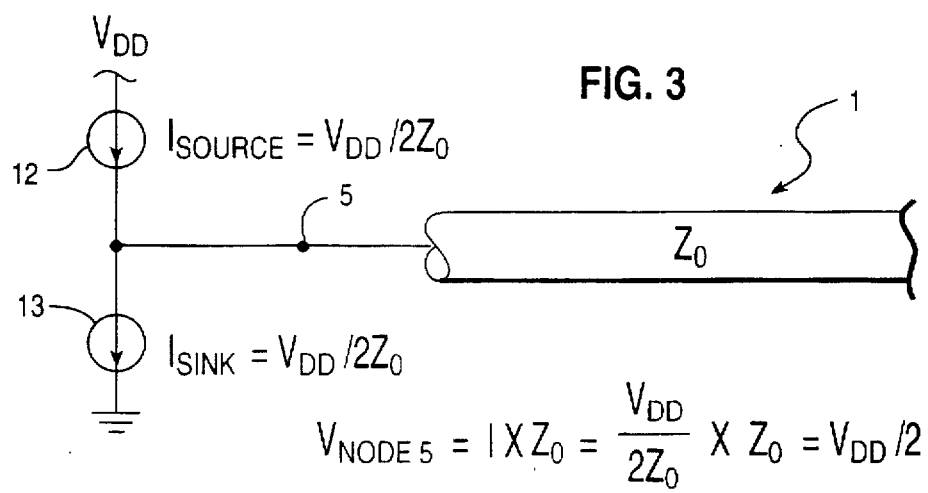
FIG. 3 is a schematic depicting the functions performed when driving a line with current sources and sinks according to the present invention.

The output driver is functionally depicted in FIG. 3. As shown in the figure, current source 12 and current sink 13 are connected in series between the supply voltage $V_{DD}$ and ground. The input to the transmission line, node 5, is connected between the two current source generators. To satisfy the boundary conditions, described earlier with reference to FIG. 1, current source generators 12 and 13 are designed to conduct current at a value of $V_{DD}/2Z_0$, and as such provide on node 5 an initial voltage pulse of magnitude $V_{DD}/2$ when current source 12 is enabled and current sink 13 is disabled. Furthermore, when the reflected pulse returns over transmission line 1 to node 5, the current sources and sinks as embodied inherently satisfy the final boundary condition of having node 5 at voltage $V_{DD}$ by adjustably clamping the currents provided by the source and sink in proportion to the reflected voltage on node 5.

Figure 4:
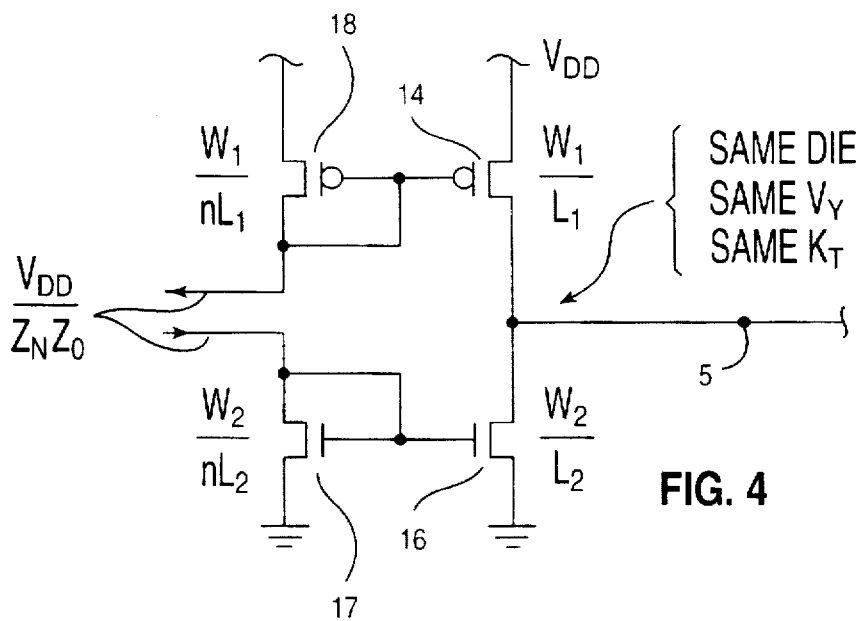
FIG. 4 is a circuit schematically illustrating the output stages of a current source driver according to the present invention.

The current source and clamping effects are accomplished using current mirrored field effect transistors as depicted in FIG. 4. The output stage field effect transistors 14 and 16 are scaled in width and length to a ratio of field effect transistors 17 and 18, the characteristics other than scaling, such as threshold voltage $V_T$ and transconductance $K_T$, matching in the mirror connected respective transistor pairs because the transistors are on the same integrated circuit die. Therefore, the low magnitude currents flowing through reference transistors 17 and 18 are matched in direct proportion by high level currents flowing in corresponding transistors 16 and 14, differing only by the scale factor "n". When transistors 14 and 16 are enable, the currents flowing in the counterpart mirrored transistors 18 and 17 are of a magnitude $V_{DD}/2nZ_0$ the enablement alternating depending on the binary state of the data to be transmitted.

What makes the current source configuration particularly attractive is that driver transistors 14 and 16 operate as current source devices over an extended range of voltages on node 5. However, as the reflected wave increases or decreases the voltage on node 5, depending on the binary state of the data being transmitted, the corresponding transistor 14 or 16 eventually decreases conduction in direct proportion to the current needed to suppress reflection. For example, if the binary state of the data being transmitted is a 1, where the 1 is represented by a voltage $V_{DD}$ across transmission line 1, transistor 14 acts as a current source providing a current of magnitude $V_{DD}/2Z_0$ until such time that the voltage on node 5 begins to approach the level of $V_{DD}$. As the voltage on node 5 approaches $V_{DD}$, transistor 14 starts to cut off and effectively reduce further current supplied to the transmission line so as to minimize any reflection. On the other hand, as long as the voltage on node 5 remain materially below $V_{DD}$, transistor 14 supplies current to the transmission line at the current service level of $V_{DD}/2Z_0$.

Figure 5:
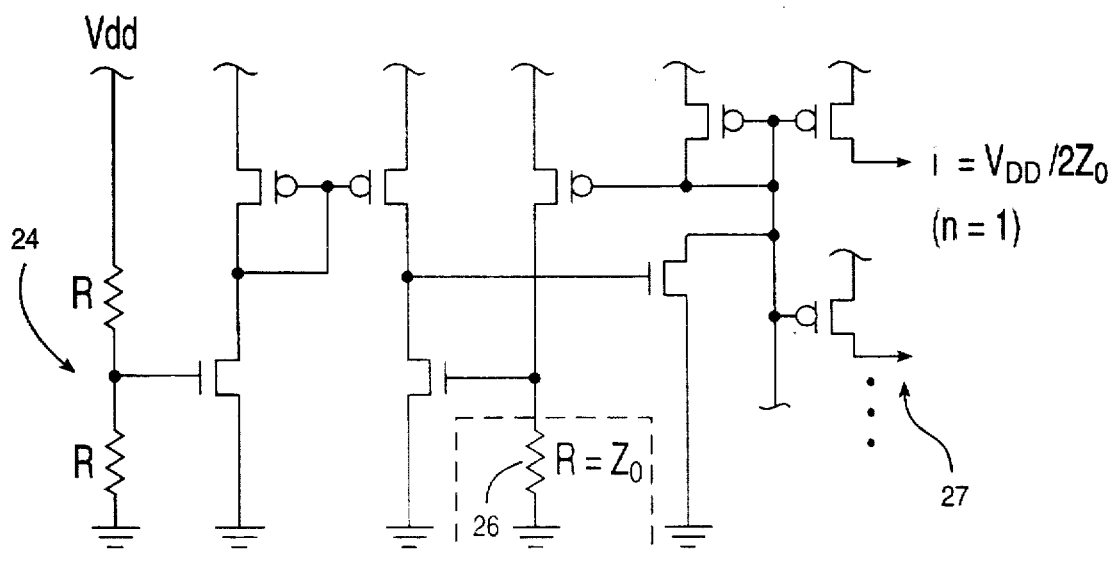
FIG. 5 is a schematic diagram of a voltage to current converter as used to generate a reference current for the driver.

A voltage to current converter suitable to generate a reference current $V_{DD}/2nZ_0$, as used by the circuit in FIG. 4, is generated using a circuit such as the one shown in FIG. 5. The actual circuit illustrated in FIG. 5 generates as an output current having a value of $V_{DD}/2Z0$ (corresponding to n=1). The circuit in FIG. 5 provides accurate reference currents by using integrated circuit component parameters which can be fairly proportioned when on a common integrated circuit chip. In this regard, the ratio but not the individual values of the resisters in divider 24 can be accurately established within the integrated circuit. Though resistor 26 cannot be precisely set to the value $Z_0$ if fabricated within the integrated circuit, that resistor may be located external, and in such location can be set with significant accuracy. Since only one voltage to current converter is needed for each chip, only one external resistor is needed. Replication of the output reference current can be accomplished as shown at 27, through the use of additional current mirrored transistors, thereby providing a matching reference current for each driver circuit in an integrated circuit chip.

Figure 6:
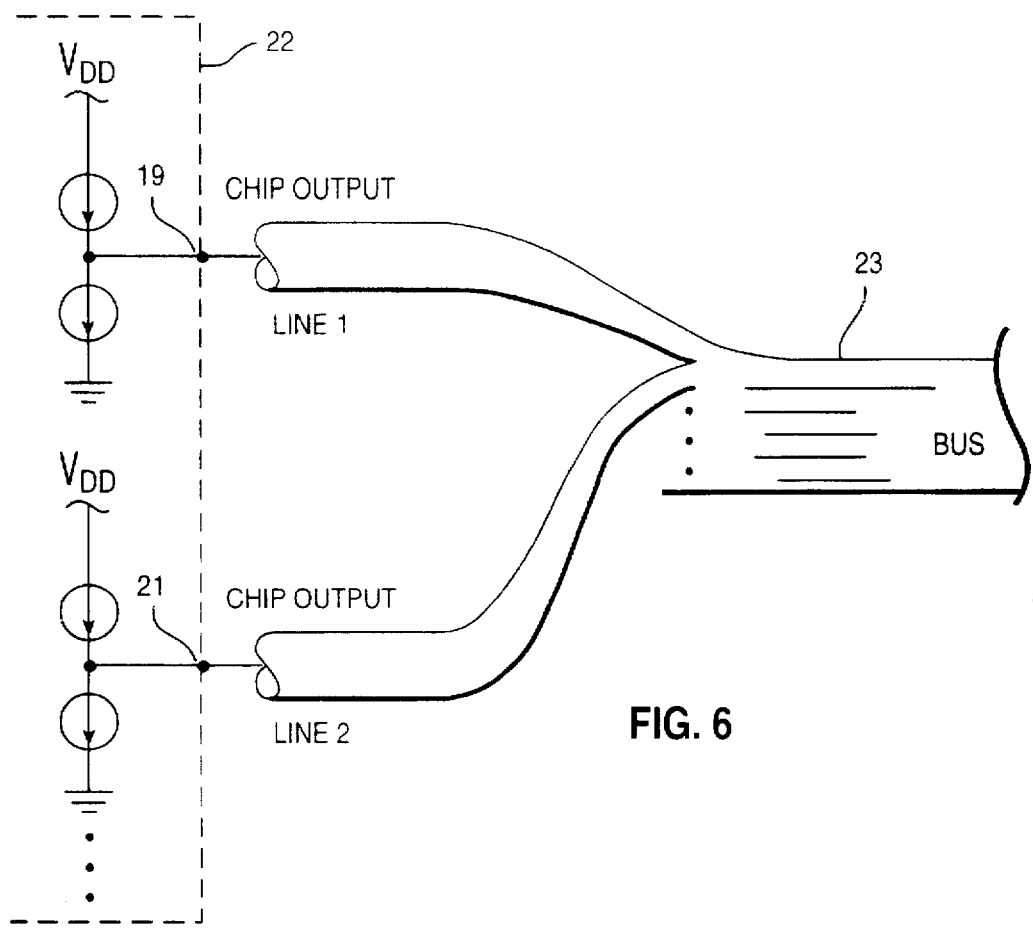
FIG. 6 is a schematic illustrating the driving of multiple bus lines.

FIG. 6 schematically illustrates the typical use of the invention, wherein output pins 19 and 21 of a chip 22 are used to drive a pair of lines from multiple line bus 23. The binary state represented by each pair of current source generators is of course determined by the data input, such as where a 0 level initiates a current sink while a 1 state level initiates the current source from within the pair of current sources driving the same line.

Figure 7:
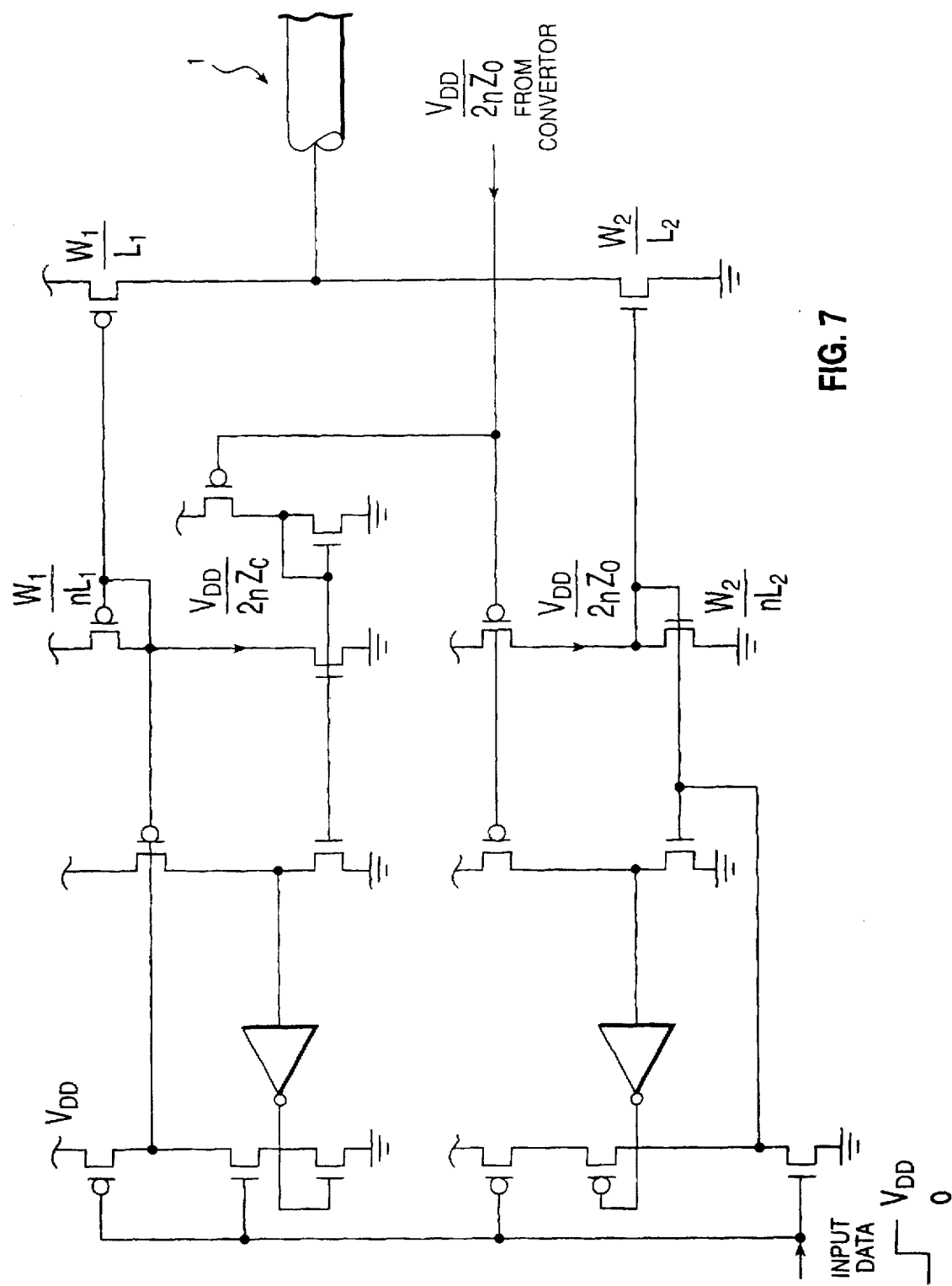
FIG. 7 is a schematic diagram of a current source transmission line driver circuit according to the present invention.

A complete circuit suitable to receive input data of binary 0 or 1 state (corresponding to 0 or $V_{DD}$ volts) and to provide an output current to a transmission line using a reference current is schematically depicted in FIG. 7. The circuit utilizes multiple current mirrors to replicate the reference current $V_{DD}/2nZ0$ and thereafter applies that reference to drive the output field effect transistors in the manner described with reference to FIG. 4.

Figure 8:
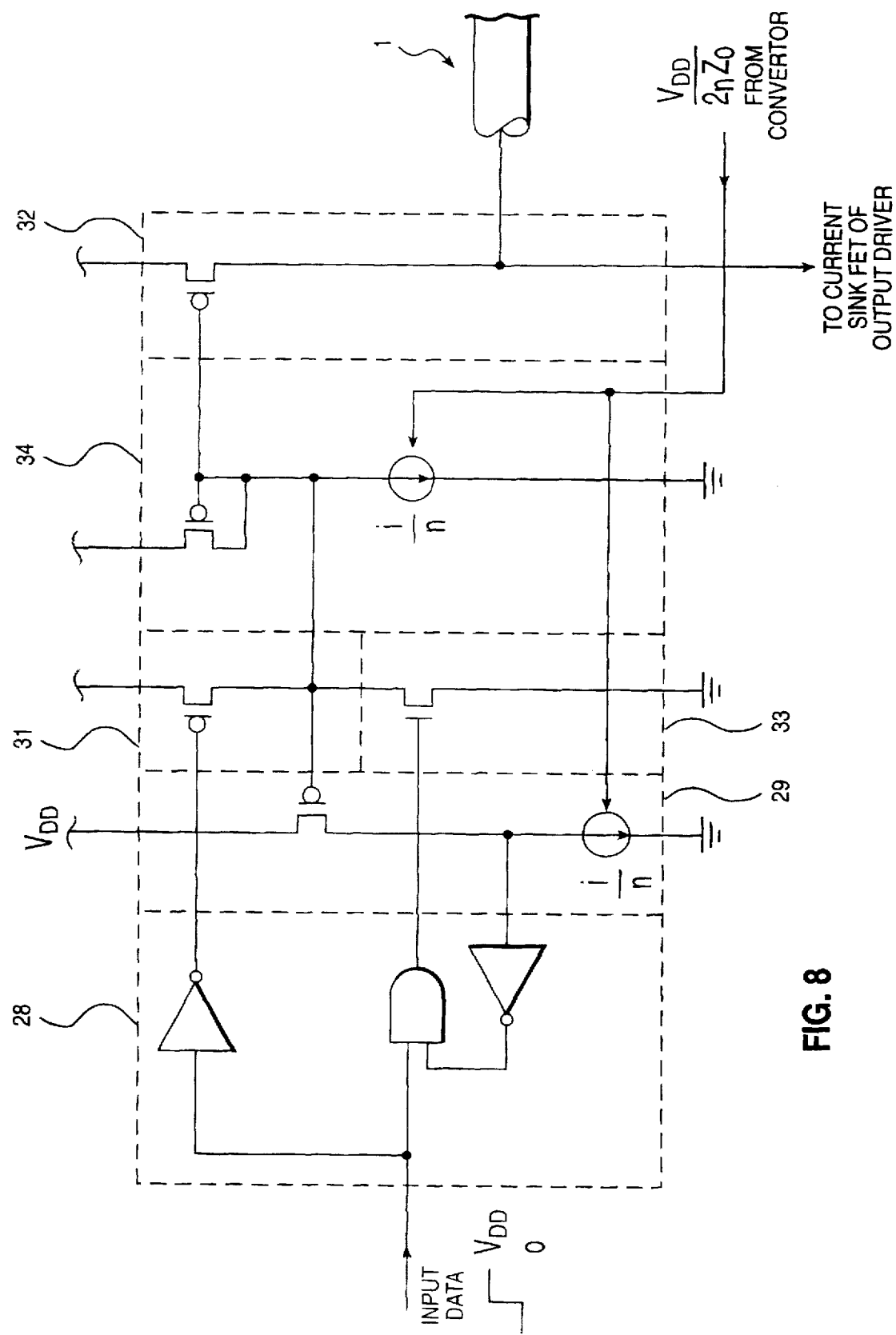
FIG. 8 is a schematic of functional grouping elements from the circuit in FIG. 7.

FIG. 8 schematically depicts by functional representation elements from the schematic in FIG. 7. Note that the representation in FIG. 8 relates to the operations of the devices in the upper half of the output driver depicted in FIG. 7, wherein the lower half is omitted in that such is a complementing organization and operation. The elements within the region enclosed by dashed line 28 provide the logic to control the on/off operation in response to the state of the input data. The elements in region enclosed by dashed line 29 sense a current flow and utilizes the logic in region 28 to speed up the turning on of the output driver. The field effect transistor in region 31 shorts out the gate of the output driver transistor in region 32 to rapidly discharge the gate to source capacitance and thereby accelerate the turn-off operation. The transistor within dashed line region 33 applies the supply voltage $V_{DD}$ to the gate electrode of the output driver transistor in region 32 for fast turn-on, again to compensate for the gate to source capacitance effects of the transistor in region 32. The elements in dashed line region 34 receive the reference signal from the converter (FIG. 5) and create a mirror for use by the output transistor in region 32, where the transistor in region 32 actually drives transmission line 1.

It will be understood by those skilled in the art that the embodiments set forth hereinbefore merely exemplary of the numerous arrangements by which the invention may be practiced, and as such may be replaced by equivalents without departing from the invention which will now be defined by appended claims.

I claim:

1. A push-pull circuit suited to drive binary signals onto a transmission line having a characteristic impedance, comprising:

series connected first and second substantially constant current sources, with a first transmission line connected to a node defined at the connection between the first and second current sources;

means for operating the first current source to drive a first current into the first transmission line responsive to a signal of first binary state;

means for disabling the second current source responsive to the signal of first binary state;

means for operating the second current source to sink a second current, substantially identical in magnitude to the first current, from the first transmission line responsive to a signal of second binary state, the second binary state being a complement of the first state; and means for disabling the first current source responsive to the signal of second binary state.

2. The apparatus recited in claim 1, wherein:

the series connected first and second current sources are connected between a supply voltage and ground; and the first and second current sources are nominally equal to half the magnitude of the supply voltage divided by the characteristic impedance of the first transmission line.

3. The apparatus recited in claim 1, wherein the first and second current sources use field effect transistors connected in a current mirror configuration with a feedback comparator to establish the current magnitudes.

4. The apparatus recited in claim 2, wherein the first and second current sources use field effect transistors connected in a current mirror configuration with a feedback comparator to establish the current magnitudes.

5. The apparatus recited in claim 1, wherein the first and second current sources are fabricated in the same integrated circuit device.

6. The apparatus recited in claim 2, wherein the first and second current sources are fabricated in the same integrated circuit device.

7. The apparatus recited in claim 3, wherein the first and second current sources are fabricated in the same integrated circuit device.

8. The apparatus recited in claim 4, wherein the first and second current sources are fabricated in the same integrated circuit device.

9. The apparatus recited in claim 2, further comprising:

a second transmission line;

series connected third and fourth current sources, with the second transmission line connected to a node defined at the connection between the third and fourth current sources, the third and fourth current sources being connected between the supply voltage and ground;

means for operating the third current source to drive a third current into the second transmission line responsive to a signal of first binary state;

means for disabling the fourth current source responsive to the signal of first binary state;

means for operating the fourth current source to sink a fourth current, substantially identical in magnitude to the third current, from the second transmission line responsive to a signal of second binary state, the second binary state being a complement of the first state;

means for disabling the third current source responsive to the signal of second binary state; and means for establishing the third and fourth currents to be nominally equal to half the magnitude of the supply voltage divided by the characteristic impedance of the second transmission line.

10. The apparatus recited in claim 9, wherein the first, second, third and fourth current sources use field effect transistors connected in a current mirror configuration with a feedback comparator to establish the current magnitudes.

11. The apparatus recited in claim 10, wherein the first, second, third and fourth current sources are fabricated in the same integrated circuit device.

12. The apparatus recited in claim 11, wherein the first and second transmission lines are part of the same bus.

* * * * *